United States Patent [19]

Takeuchi

[11] Patent Number: 5,060,033
[45] Date of Patent: Oct. 22, 1991

[54] SEMICONDUCTOR DEVICE AND METHOD OF PRODUCING SEMICONDUCTOR DEVICE

[75] Inventor: Masahiro Takeuchi, Nagano, Japan

[73] Assignee: Seiko Epson Corporation, Tokyo, Japan

[21] Appl. No.: 395,735

[22] Filed: Aug. 17, 1989

[30] Foreign Application Priority Data

Aug. 18, 1988 [JP] Japan .................. 63-205535

[51] Int. Cl.⁵ .............. H01L 29/78; H01L 27/06
[52] U.S. Cl. .................. 357/23.4; 357/23.1; 357/41; 357/42
[58] Field of Search ............ 357/23.4, 23.1, 41, 357/42

[56]  References Cited

U.S. PATENT DOCUMENTS

| | | | |
|---|---|---|---|
| 3,921,283 | 11/1975 | Shappir | 29/571 |
| 4,016,594 | 4/1977 | Shappir | 357/41 |
| 4,261,761 | 4/1981 | Sato et al. | 357/23.4 |
| 4,506,279 | 3/1985 | Mizutani | 357/23.4 |
| 4,579,824 | 7/1986 | Shinada et al. | 357/23.4 |
| 4,881,119 | 11/1989 | Paxman et al. | 357/23.4 |
| 4,924,277 | 5/1990 | Yamane et al. | 357/23.4 |
| 4,928,156 | 5/1990 | Alvis et al. | 357/23.4 |
| 4,939,558 | 7/1990 | Smayling et al. | 357/23.4 |

FOREIGN PATENT DOCUMENTS

| | | |
|---|---|---|
| 53-127273 | 11/1978 | Japan . |
| 54-16194 | 6/1979 | Japan . |
| 56-87368 | 7/1981 | Japan . |
| 60-180167 | 9/1985 | Japan . |
| 60-235471 | 11/1985 | Japan . |

OTHER PUBLICATIONS

Wei, Ching-Yeu; Pimbley, J. M.; and Nissan-Cohen, Y.; "Buried and Graded/Buried LDD Structures for Improved Hot-Electron Reliability", IEEE Electron Device Letters, vol. EDL-7, No. 6, Jun. 1986.

Primary Examiner—Rolf Hille
Assistant Examiner—Tan Ho
Attorney, Agent, or Firm—Spensley Horn Jubas & Lubitz

[57]  ABSTRACT

A semiconductor device composed of: a semiconductor substrate of a first conductivity type having a first impurity concentration; a belt-shaped impurity layer of the first conductivity type which is formed in the substrate so as to be spaced apart from a surface of the substrate and which has a second impurity concentration which is higher than the first concentration at a first depth from the surface of the substrate; a gate electrode formed on the substrate via a first insulating film; a second impurity layer of a second conductive type which is formed in the substrate on both sides of the gate electrode such as to be spaced apart from each other and has a third impurity concentration at a second depth from the surface of the semiconductor substrate, whose lower surface abuts against the first impurity layer or is present thereabove, the second impurity layer having a configuration projecting downward of the gate electrode at a portion thereof adjacent to the first impurity layer; side wall insulating films each formed on a side wall of the gate electrode; and a third impurity layer of the second conductivity type which is formed in the second impurity layer laterally of the side wall insulating film and has a fourth concentration higher than the third concentration.

7 Claims, 12 Drawing Sheets

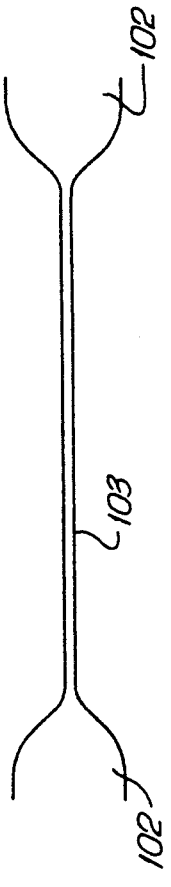
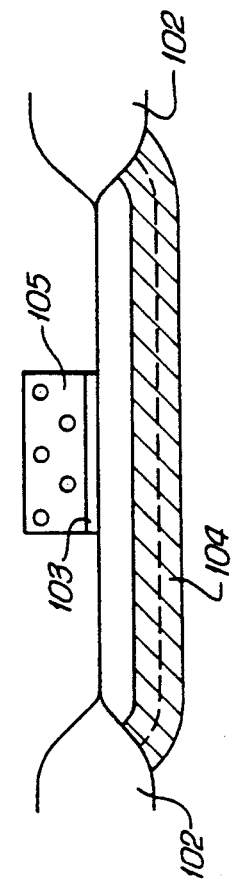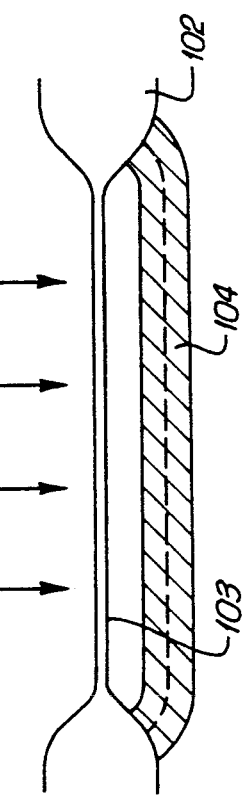
Fig. 1a
Fig. 1b
Fig. 1c
Fig. 1d

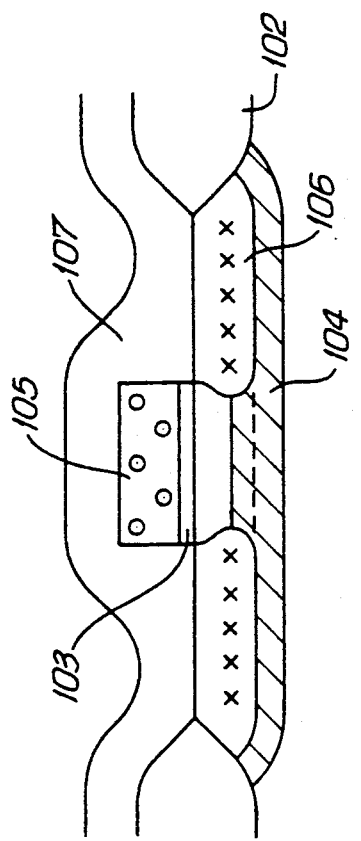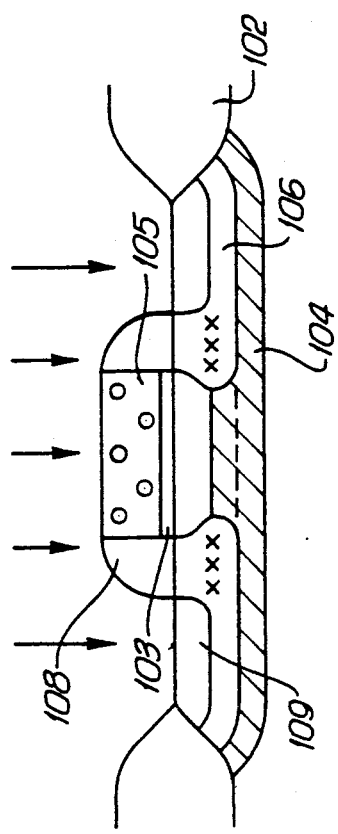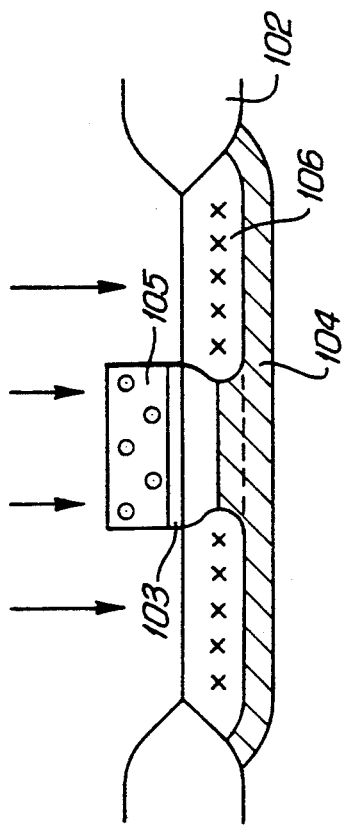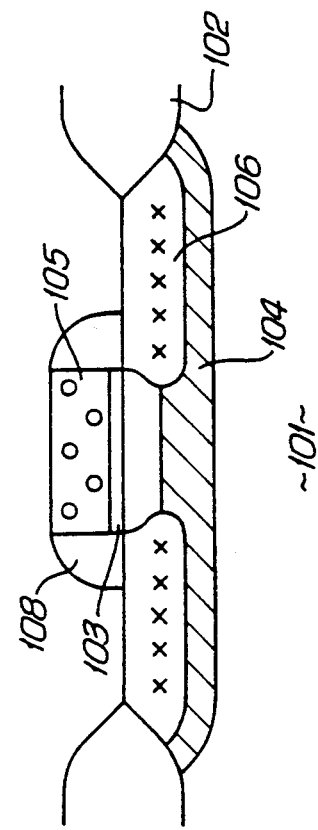

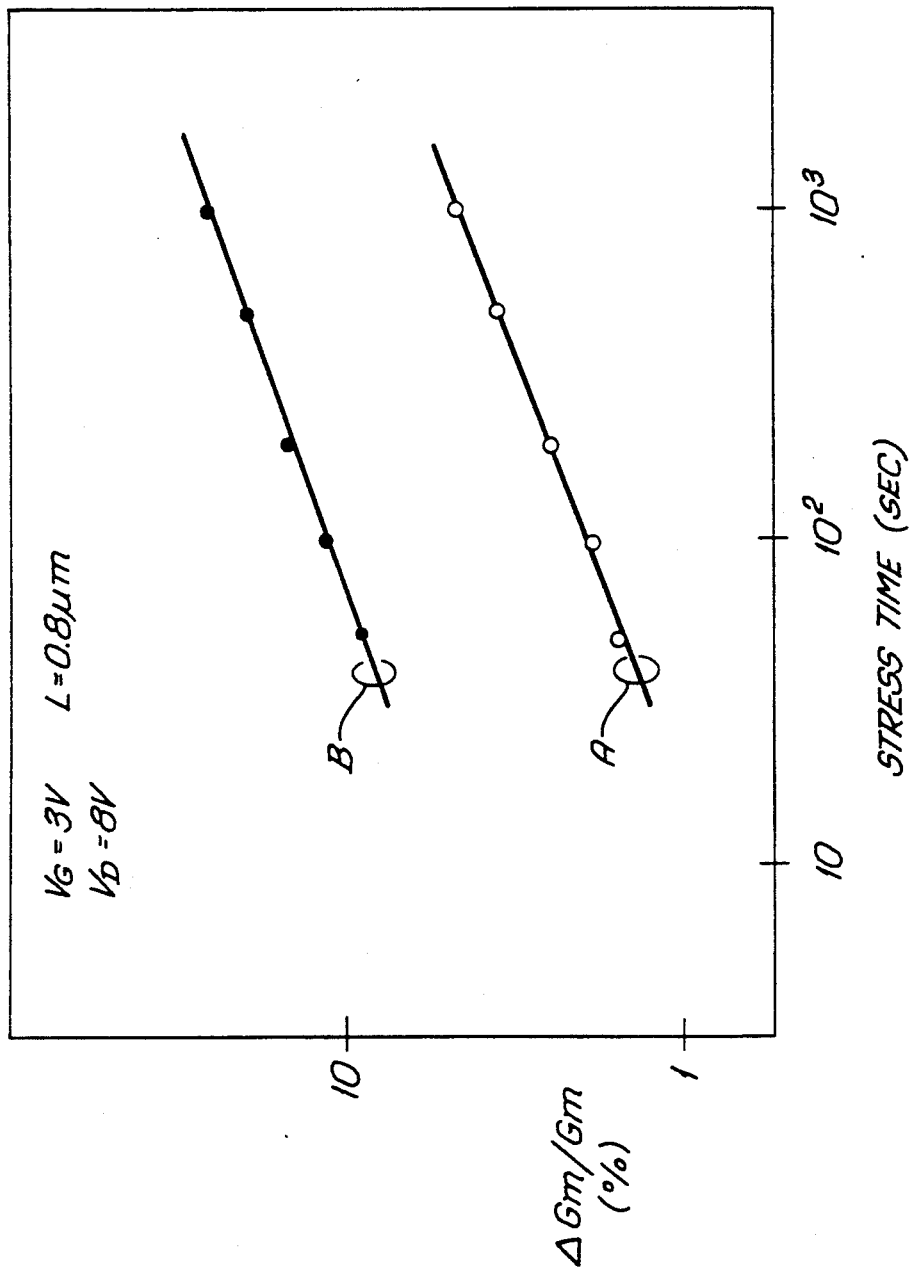

SEMICONDUCTOR DEVICE AND METHOD OF PRODUCING SEMICONDUCTOR DEVICE

BACKGROUND OF THE INVENTION

The present invention relates to a semiconductor device, and more particularly to the structure of an MOS or MIS semiconductor device and a method of producing the same.

In recent years, the trend toward increasing levels of circuit integration is underway in semiconductor devices. This also applies to MOS transistors, and the circuit dimensions of this type of device have become extremely small, reaching even submicron regions. As such a trend toward smaller circuit dimensions progresses, a phenomenon called punch-through takes place in which a current flows between a source and a drain irrespective of the gate voltage. To solve this problem, a method for increasing the density of impurities in a portion deeper than a substrate surface are known, as disclosed in Japanese Patent Publication No. 16194/1979 and Japanese Patent Laid-Open Applications Nos. 127273/1978, 180167/1985, and 235471/1985. A description will be given of this method with reference to FIG. 2. In FIG. 2, reference numeral 201 denotes a p-type semiconductor substrate, such as a P-type silicon substrate; 202, an element isolating insulation film; 203, a gate insulating film; 209, a source region and a drain region both formed of an n-type layer of high-concentration impurities; 205, a gate electrode; and 204, a p-type layer of impurities having a higher concentration of impurities than the semiconductor substrate 201. Even if the depletion layer of the drain spreads on application of a voltage to the drain, the spreading of the depletion layer is held by the p-type layer of impurities 204, thereby preventing the occurrence of a punch-through.

In addition, if the trend toward smaller circuit dimensions is advanced with a supply voltage fixed, deterioration of characteristics occurs due to hot carriers. To solve this problem, a structure called an LDD (lightly doped drain) was proposed. However, a structure in which further improvements are made on this LDD is disclosed in the following literature 1: Ching-Yeu Wei, J. M. Pimbley, Y. Nissan-Cohen, "Buried and Graded/-Buried LDD structures for Improved Hot-Electron Reliability", IEEE Electron Device Lett., Vol. EDL-7, No. 6, pp. 380-382, June 1986. A description of this structure will be given with reference to FIG. 3. In FIG. 3, reference numeral 301 denotes a p-type silicon substrate formed of a p-type semiconductor; 302, an element isolating insulating film formed of an oxide film or the like; 303, a gate insulating film formed of an oxide film or the like; 305, a gate electrode; 309, a source region and a drain region both formed of an n-type layer of high-concentration impurities; 306, a source region and a drain region both formed of an n-type layer of low-concentration impurities; 308, a side wall insulating film; and 304, a p-type layer of impurities having a higher concentration of impurities than the semiconductor substrate 301. The source region and the drain region formed of the n-type layer 306 of low-concentration impurities is deeper than the channel of an MOS-type transistor, and extends inwardly of the gate electrode. As a result, since the passage of a current flowing through the channel is bent downward at a drain end, and a spot where hot carriers are generated also moves to the inside of the substrate, it has been known that the frequency at which the generated hot carriers jump into the interface between the gate oxide film and the channel is reduced, thereby minimizing the deterioration rate of the MOS transistor due to hot carriers.

However, since in the conventional example shown in FIG. 2 the concentration of impurities in a portion deeper than the substrate surface is made higher, a punch-through is unlikely to occur, but since no measures have been taken with respect to the concentration of an electric field in the vicinity of a drain, there has been a problem in that the characteristics become deteriorated due to hot carriers.

In addition, although in the conventional example shown in FIG. 3 deterioration of the characteristics due to hot carriers is minimized, there has been a drawback in that since the source region and the drain region project inwardly of the gate electrode, a drain depletion layer and a source depletion layer are liable to be connected to each other, possibly resulting in a punch-through. Furthermore, since the threshold voltage of the MOS transistor is also involved, if the p-type layer 304 having a concentration of impurities higher than that of the semiconductor substrate 301 is formed in the vicinity of the surface of the semiconductor substrate 301, an avalanche phenomenon is liable to occur in the vicinity of the surface, with the adverse result that the deterioration of the MOS transistor becomes great.

SUMMARY OF THE INVENTION

Accordingly, an object of the present invention is to provide an MOS transistor which prevents punch-through even if the circuit dimension thereof becomes very small and the deterioration of characteristics thereof due to hot carriers is minimized, thereby overcoming the above-described drawbacks of the conventional art.

To this end, according to one aspect of the present invention there is provided a semiconductor device comprising: a semiconductor substrate of a first conductivity type having a first concentration; a first belt-shaped impurity layer of the first conductivity type which is formed in the semiconductor substrate such as to be spaced apart from a surface of the semiconductor substrate and which has a second concentration which is higher than that of the first concentration at a first depth from the surface of the semiconductor substrate; a gate electrode formed on the semiconductor substrate via a first insulating film; impurity regions of a second conductivity type which are formed in the semiconductor substrate on both sides of the gate electrode such as to be spaced apart from each other and having a third concentration at a second depth from the surface of the semiconductor substrate, the lower surface of the regions abutting against the first impurity layer or being present thereabove, the impurity regions having a configuration projecting downward of the gate electrode at a portion thereof adjacent to the first impurity layer; side wall insulating films each formed on a side wall of the gate electrode; and a second impurity layer of the second conductivity type which is formed in the impurity regions laterally of the side wall insulating film and having a fourth concentration higher than the third concentration.

According to another aspect of the present invention, there is provided a method of producing a semiconductor device, comprising the steps of: forming a first insulating film on a semiconductor substrate of a first conductivity type; ion-implanting first impurities of the first conductivity type into the semiconductor substrate; forming a gate electrode on the first insulating film; ion-implanting second impurities of a second conductivity type opposite to the first conductive type of the semiconductor substrate into the semiconductor substrate with the gate electrode serving as a mask, in such a manner that a peak of the concentration of the second impurities is lower than a peak of the concentration of the first impurities; forming a side wall insulating film on the gate electrode by means of a second insulating film; and ion-implanting third impurities of the second conductivity type into the semiconductor substrate with the gate electrode and the side wall insulating film serving as masks.

The above and other objects, features and advantages of the present invention will become more apparent from the following detailed description of the invention when read in conjunction with the accompanying drawings.

BRIEF DESCRIPTION OF THE DRAWINGS:

FIGS. 1(a) to 1(h) are cross-sectional views of stages in a process according to an embodiment of a method of producing a semiconductor device in accordance with the present invention, in which FIG. 1(h) is a schematic cross-sectional view illustrating an embodiment of the semiconductor device in accordance with the present invention.

FIG. 13 is a diagram illustrating the time dependence of deterioration in Gm due to hot carriers of an MOS transistor, in which A relates to an embodiment of the invention, while B relates to a conventional example.

Figure 2:
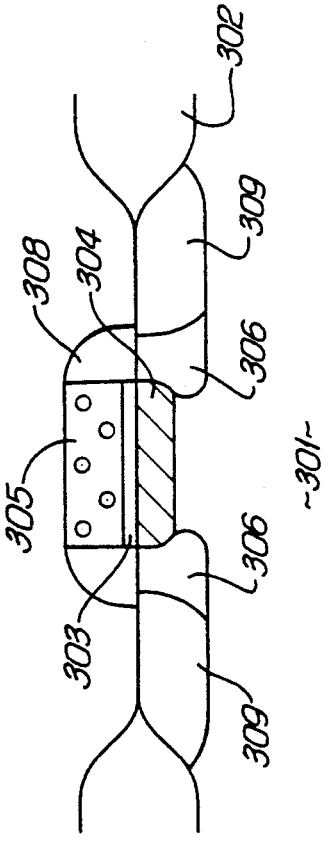
FIGS. 2 and 3 are schematic cross-sectional views of conventional semiconductor devices.
Figure 3:
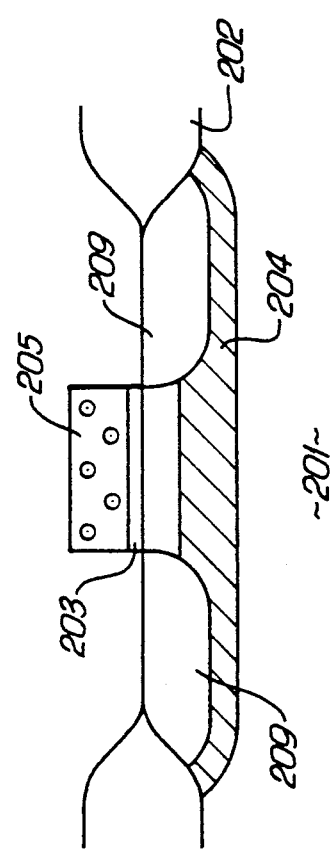

DESCRIPTION OF THE PREFERRED EMBODIMENTS:

A detailed description will be given of an embodiment of the present invention with reference to FIGS. 1(a) to 1(h). FIG. 1(h) is a cross-sectional view of an MOS transistor in a final process in accordance with the present invention. As shown in FIG. 1(h), the MOS transistor in accordance with the present invention comprises a semiconductor substrate 101, e.g., a p-type silicon substrate; an element isolating separating insulation film 102, e.g., a silicon oxide film; an insulating film 103, such as a gate insulating film constituted by a silicon oxide film; a p-type layer 104 having an impurity concentration higher than that of silicon substrate 101; a gate electrode 105; source and drain regions 106 formed by an n-type layer of low-concentration impurities; a side wall insulating film 108 formed from a silicon oxide film 107 or the like; and source and drain regions 109 formed by an n-type layer of high-concentration impurities. The mark - indicates the location in layer 104 at which the concentration of impurities of the p-type layer of concentration impurities becomes maximum.

The mark X indicates the locations where the concentration of impurities of the n-type regions 106 of low-concentration impurities becomes maximum.

First, as shown in FIG. 1(a), a semiconductor substrate of a first conductivity type, i.e., the p-type silicon substrate 101 in this case, is subjected to oxidation at 1,000° C. in an oxidizing atmosphere so as to form a silicon oxide film with a 500 Å thickness. Subsequently, a silicon nitride film with a thickness of 200 Å is formed by the CVD process. Then, after unnecessary portions of the silicon nitride film are removed by a photoetching process, the silicon substrate 101 is subjected to oxidation at 1,000° C. in a wet atmosphere to form an element isolating insulation film 103 constituted by an oxide film with an approximate 1 μm thickness, and the aforementioned silicon nitride film is then removed. Through these processes, the silicon oxide film which serves as the element isolating insulation film 102 is formed on the p-type silicon substrate 101, as shown in FIG. 1(a).

Subsequently, as shown in FIG. 1(b), the p-type silicon substrate 101 is subjected to oxidation at 1,000° C. in an oxidizing atmosphere, and a gate insulating film 103 constituted by an oxide film with a 200 Å thickness is formed on the p-type silicon substrate 101.

Then, as shown in FIG. 1(c), p-type impurities, e.g., boron, are ion-implanted at a dosage of $1 \times 10^{12} \text{cm}^{-2}$ to $1 \times 10^{14} \text{cm}^{-2}$ and at an acceleration voltage of 60 KeV to 200 KeV to form the p-type layer 104 having an impurity concentration higher than that of the silicon substrate.

Then, as shown in FIG. 1(d), after a polycrystalline silicon film having a thickness of 6,000 Å is formed by the CVD process, unnecessary portions of that film are removed by a photoetching process so as to form the gate electrode 105.

Subsequently, as shown in FIG. 1(e), n-type impurities, e.g., phosphorous are ion-implanted at a dosage of $1 \times 10^{12} \text{cm}^{-2}$ to $1 \times 10^{14} \text{cm}^{-2}$ and at an acceleration voltage of 80 KeV to 180 KeV with the gate electrode 105 and the element isolating insulation film 102, constituted by the silicon oxide film, serving as masks so as to form the n-type layer 106 of low-concentration impurities for the source and drain regions.

Then, as shown in FIG. 1(f), after the silicon oxide film 107 with a 6000 Å thickness is formed on the semiconductor substrate 101 and the gate electrode 105 by means of the CVD process, reactive ion-etching is performed so as to form the side wall insulating film 108 from the silicon oxide film, as shown in FIG. 1(g).

Subsequently, as shown in FIG. 1(h), n-type impurities, e.g., arsenic, are ion-implanted at a dosage of $1 \times 10^{16} \text{cm}^{-2}$ and at an acceleration voltage of 80 KeV with the gate electrode 105, the side wall insulating film 108, and the element isolating insulation film 102 serving as masks so as to form the n-type layer, or regions, 109 of high-concentration impurities for the source and drain regions.

Finally, to activate the ion-implanted layers, the MOS transistor is subjected to annealing at 800° C. to 1100° C. In the case of the MOS transistor thus formed, if the concentration of the p-type impurities of the p-type silicon substrate 101, i.e., the concentration of impurities of boron in this case, is set to $5 \times 10^{15} \text{cm}^{-3}$, the maximum value of the concentration of impurities of the n-type layer 106 of low-concentration impurities becomes $1 \times 10^{16} \text{cm}^{-3}$ to $6 \times 10^{18} \text{cm}^{-3}$, and a location at which the value becomes maximum is 0.05 to 0.25 μm deep from the surface of the silicon substrate, so that the n-type layer 106 of low-concentration impurities projects 0.05 to 0.15 μm inwardly of, or under, the gate electrode 105.

In each of FIGS. 5, 9, 10, 11 and 12, to be described in detail below, there are two curves and two ordinate scales. Each curve is associated with an arrow pointing to its corresponding ordinate scale.

The curves of FIGS. 9, 10, 11, 12 and 13 were all made with a gate voltage, $V_G$, of +3V and a drain voltage, $V_D$, OF +8V relative to the substrate.

Figure 5:
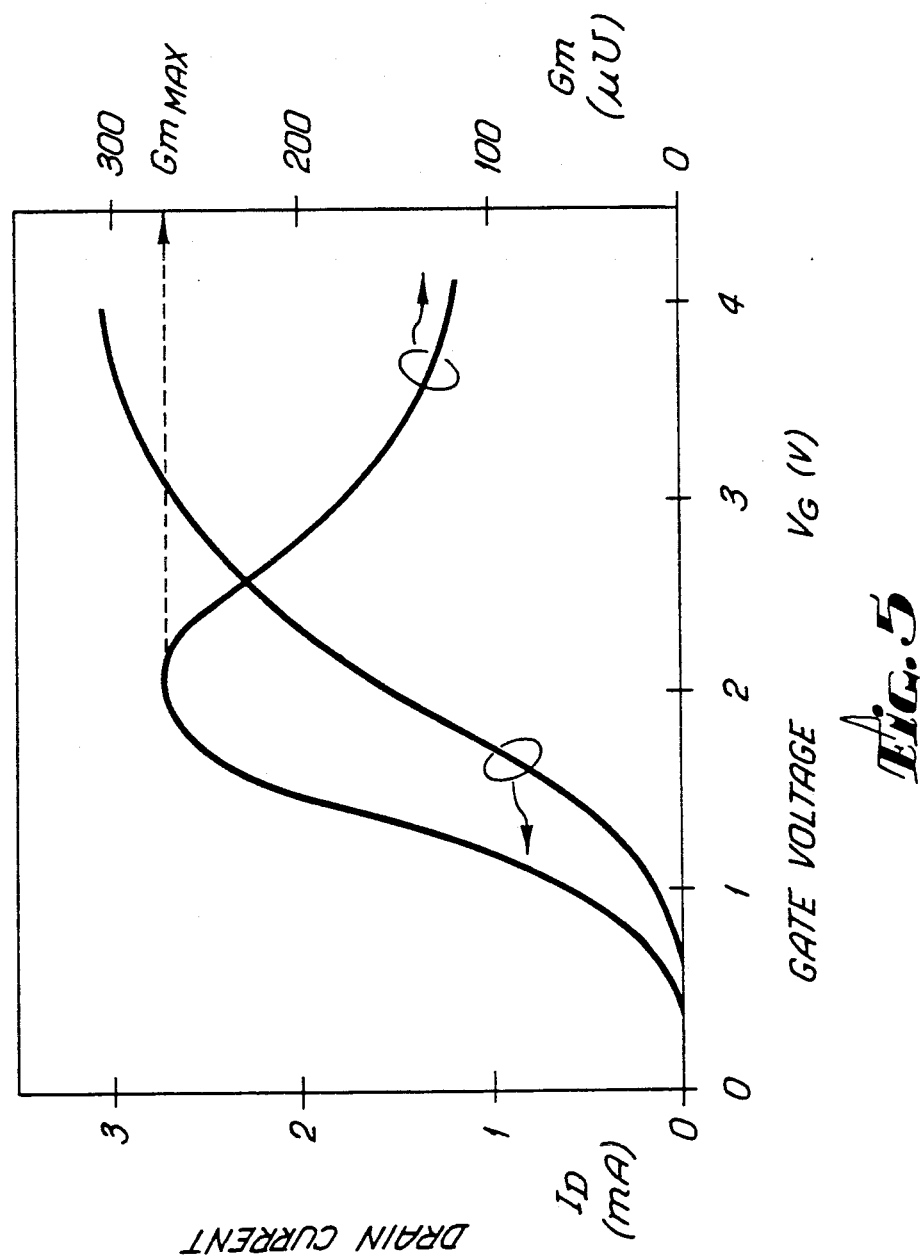
FIG. 5 is a graph explaining $Gm_{MAX}$.
Figure 6:
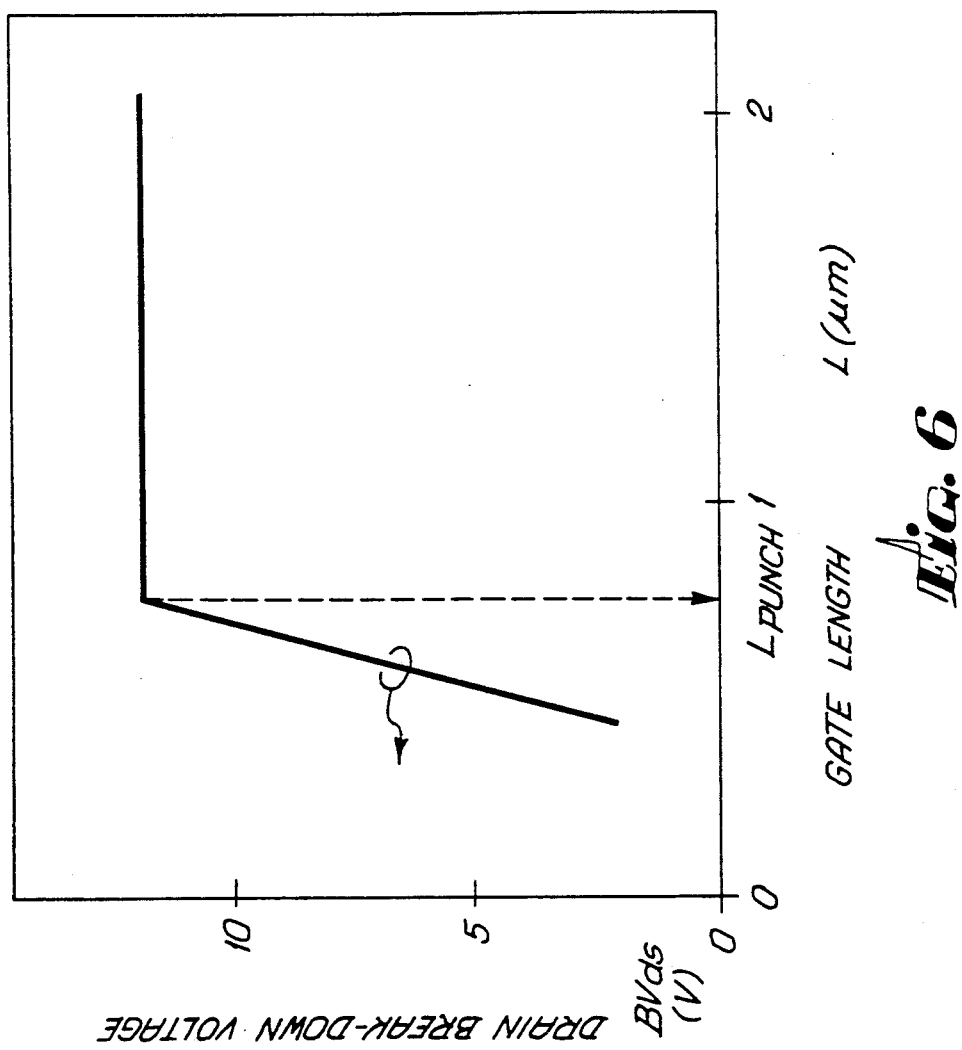
FIG. 6 is a graph explaining $L_{punch}$.
Figure 9:
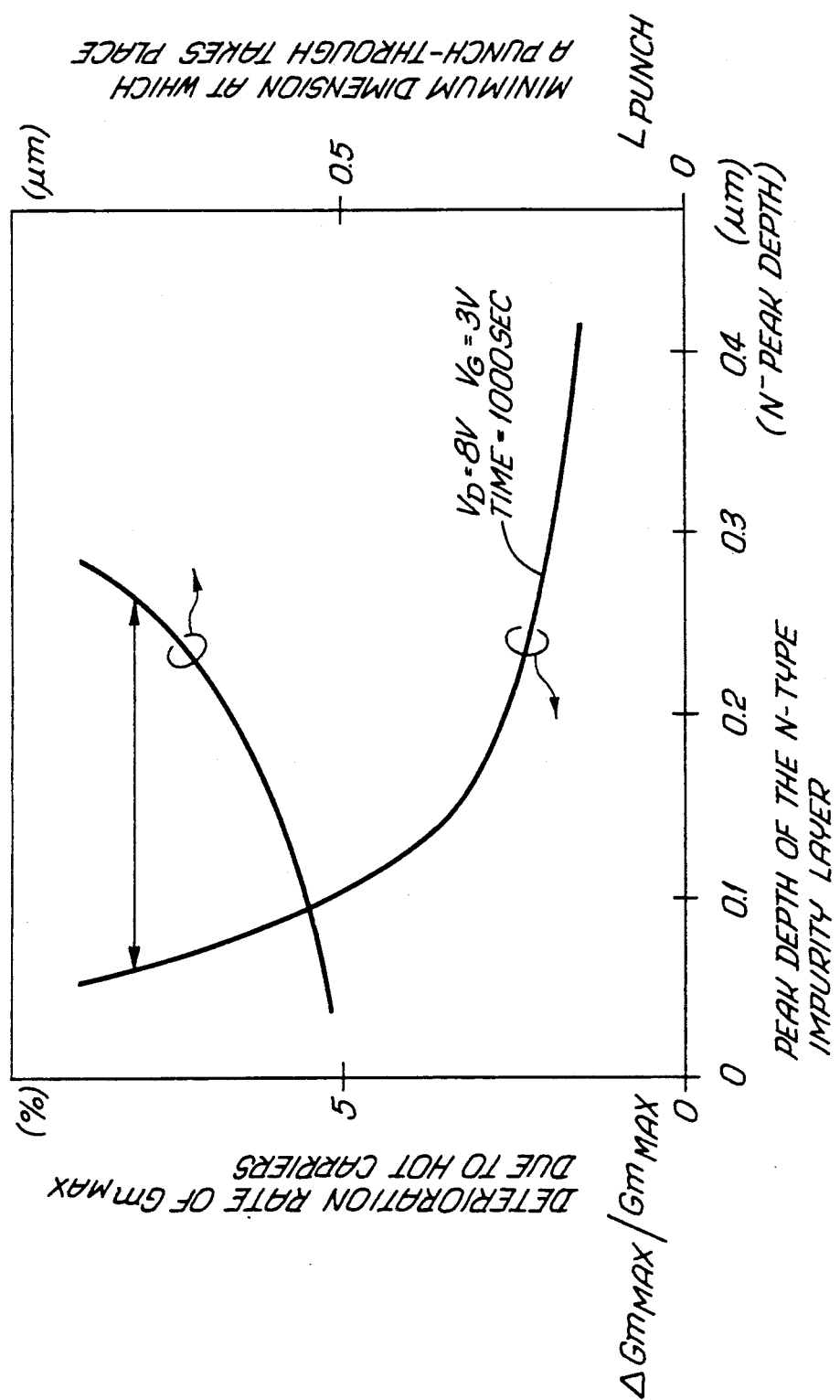
FIGS. 9 to 12 are graphs respectively illustrating deterioration rate of $Gm_{MAX}$ due to hot carriers and a minimum dimension $L_{punch}$ at which a punch-through takes place.
Figure 10:
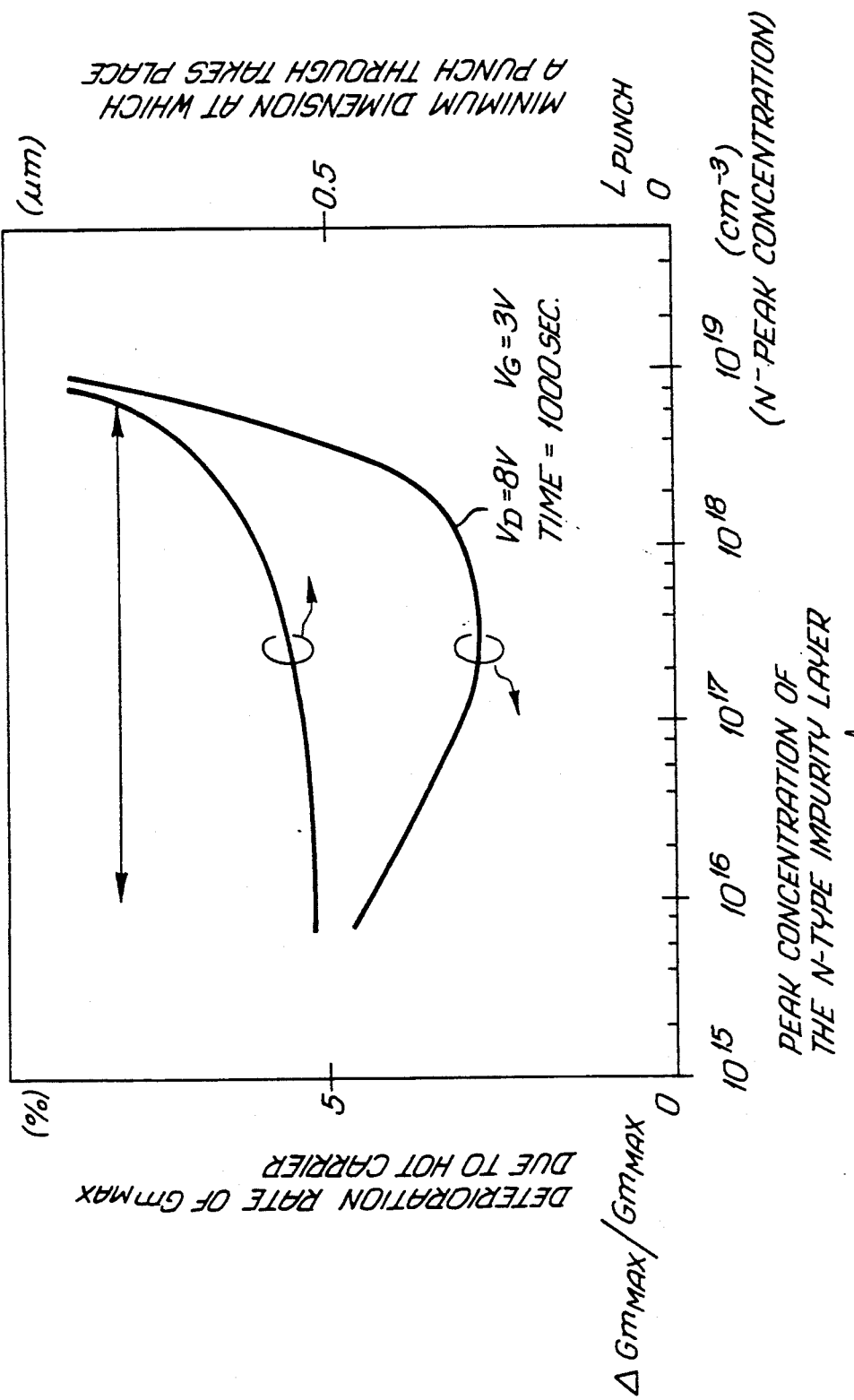
Figure 11:
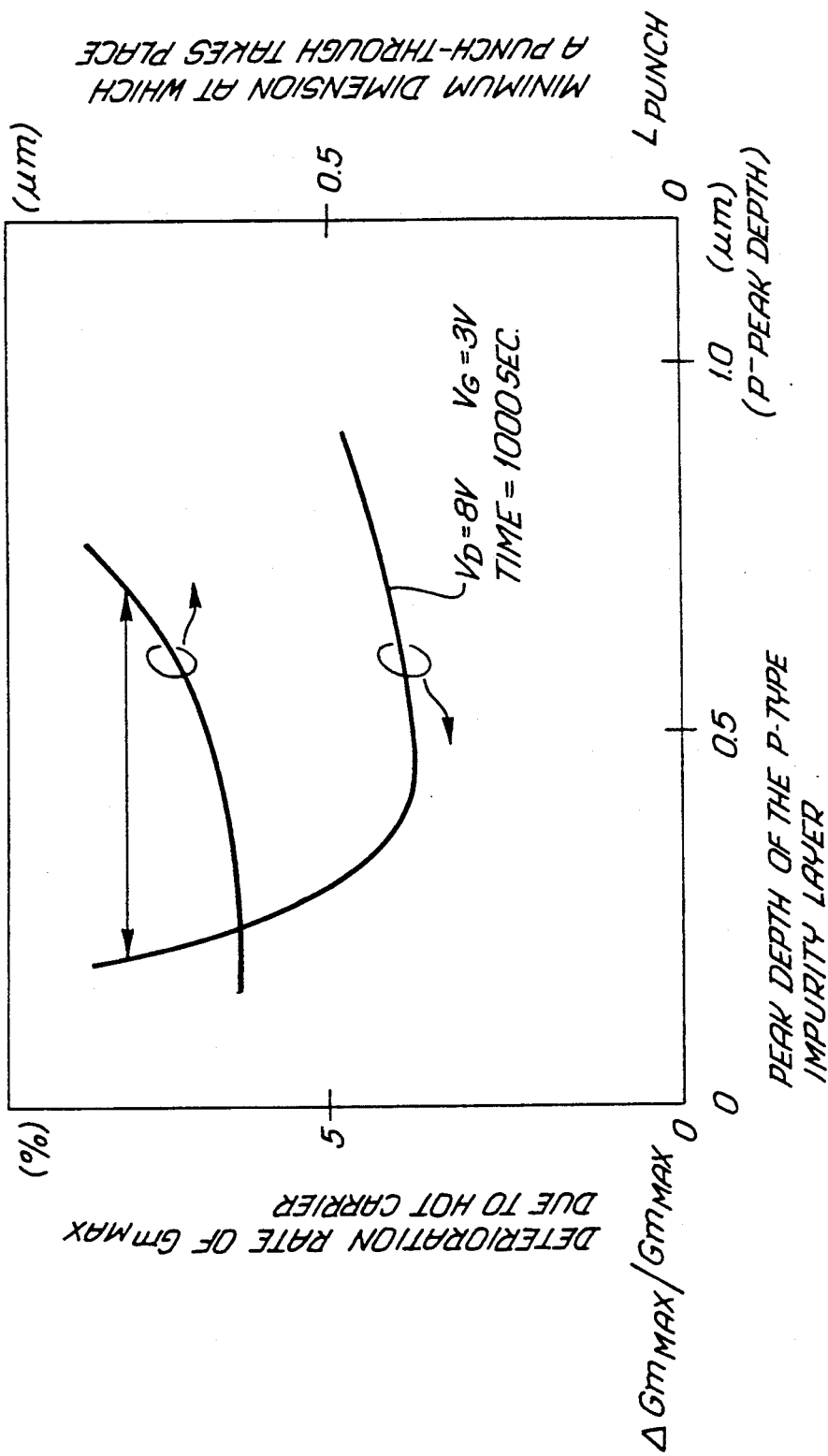

FIG. 9 is a graph illustrating the depth of the location at which the concentration of impurities of the n-type layer 106 of low-concentration impurities becomes maximum, the deterioration rate of Gm due to hot carriers, and the minimum dimension at which a punch-through takes place. FIG. 10 is a graph illustrating the maximum value of the concentration of the n-type layer 106 of low-concentration impurities, the deterioration rate of $Gm_{MAX}$ due to hot carriers, and the minimum dimension at which a punch-through takes place. As for $Gm_{MAX}$ referred to herein, the value of Gm is obtained by differentiating $I_D$ with $V_G$ in the graph of gate voltage $V_G$ and drain current $I_D$ of the MOS transistor, as shown in FIG. 5, and the maximum value of Gm is set as $Gm_{MAX}$. In addition, as for the minimum dimension at which a punch-through takes place, if a graph is plotted with respect to drain breakdown voltage BVds and a gate length L when the gate is connected to ground, as shown in FIG. 6, and if the gate length L becomes shorter than a certain gate length, BVds starts to decline. Such a gate length is set as a minimum dimension $L_{punch}$ at which a punch-through takes place.

Both FIGS. 9 and 10 show favorable values with respect to both the deterioration rate of $Gm_{MAX}$ due to hot carriers and the minimum dimension at which a punch-through takes place in accordance with the range of the above-described embodiment. This can be considered as follows: The deeper from the substrate surface the maximum concentration of impurities of the n-type layer 106 of low-concentration impurities, the deeper from the substrate surface is the spot at which hot carriers are generated in the vicinity of a drain, so that the rate of deterioration of $Gm_{MAX}$ due to hot carriers becomes small. However, since a punch-through is otherwise liable to occur, it is impossible to deepen the maximum concentration location unduly. There is an optimum range for this location.

Furthermore, the effect of alleviation of an electric field in the vicinity of a drain changes due to the concentration of impurities of the n-type layer 106 of low-concentration impurities, so that the rate of deterioration of $Gm_{MAX}$ also changes. In other words, the rate of deterioration of $Gm_{MAX}$ due to hot carriers becomes large if this concentration of impurities is too high or too low.

In addition, since the tendency of occurrence of a punch-through also changes due to this concentration of impurities, there is an optimum range. If it is assumed that the deterioration rate of $Gm_{MAX}$ due to hot carriers is 8% or less and the minimum dimension at which a punch-through takes place is 0.8 μm, an optimal range of the location at which the concentration of impurities of the n-type layer 106 of low-concentration impurities becomes maximum can be determined from FIG. 9 to be 0.05 to 0.25 μm from the surface of the silicon substrate, preferably 0.08 to 0.2 μm for reducing the deterioration rate of $Gm_{MAX}$ due to hot carriers, and more preferably 0.1 to 0.18 μm.

In addition, if it is assumed that the deterioration rate of $Gm_{MAX}$ due to hot carriers is 8% or below and the minimum dimension at which a punch-through takes place is 0.8 μm, the optimal range of the peak concentration of impurities of the n-type layer 106 of low-concentration impurities can be determined from FIG. 10 to be in the range of $1 \times 10^{16} cm^{-3}$ to $6 \times 10^{18} cm^{-3}$, preferably $2 \times 10^{16} cm^{-3}$ to $2 \times 10^{18} cm^{-3}$ for reducing the deterioration rate of $Gm_{MAX}$ due to hot carriers, and more preferably $1 \times 10^{17} cm^{-3}$ to $1 \times 10^{18} cm^{-3}$.

Figure 7:
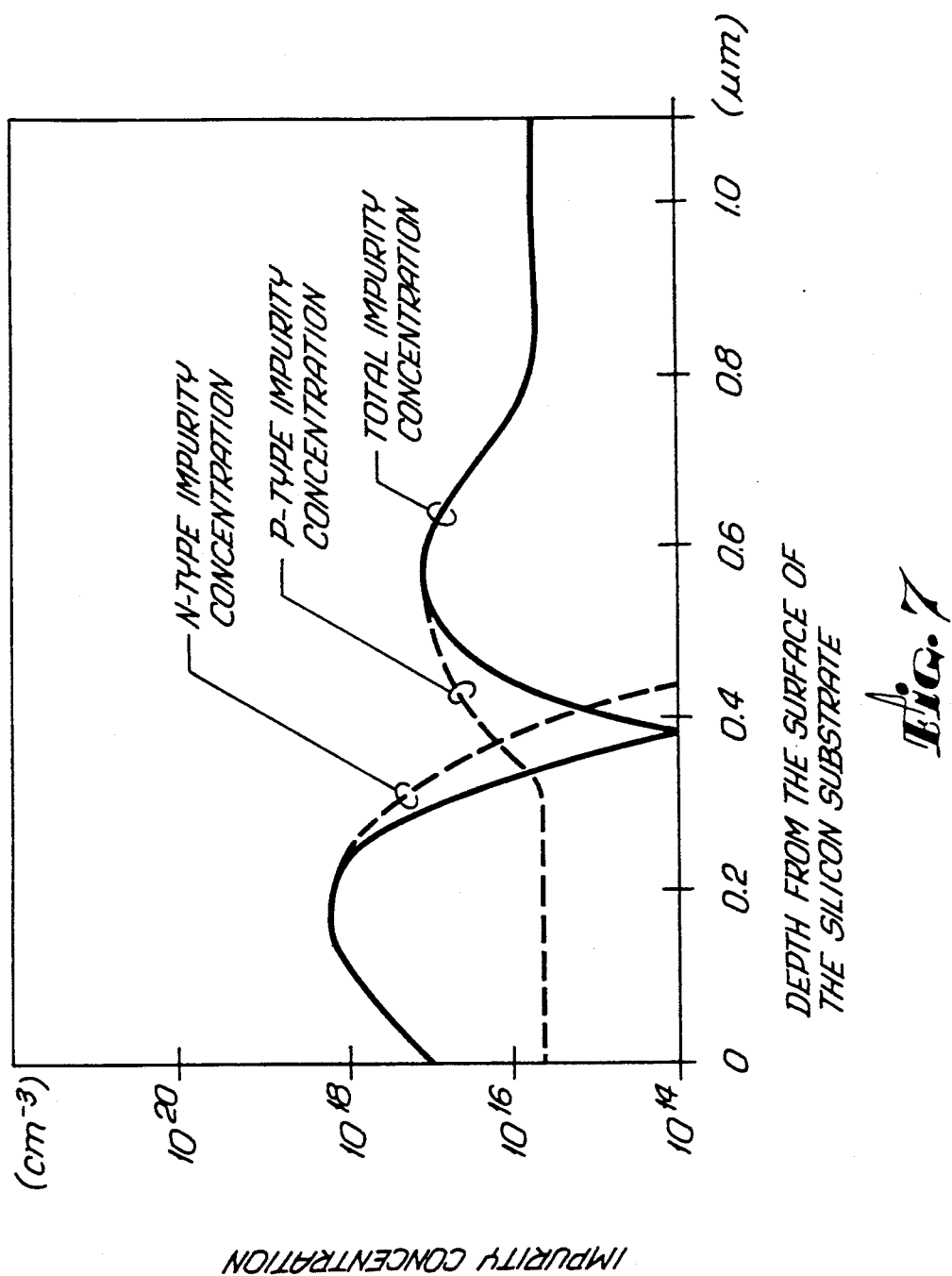
FIGS. 7 and 8 are graphs illustrating a profile of impurities in the direction of the depth of a substrate.
Figure 8:
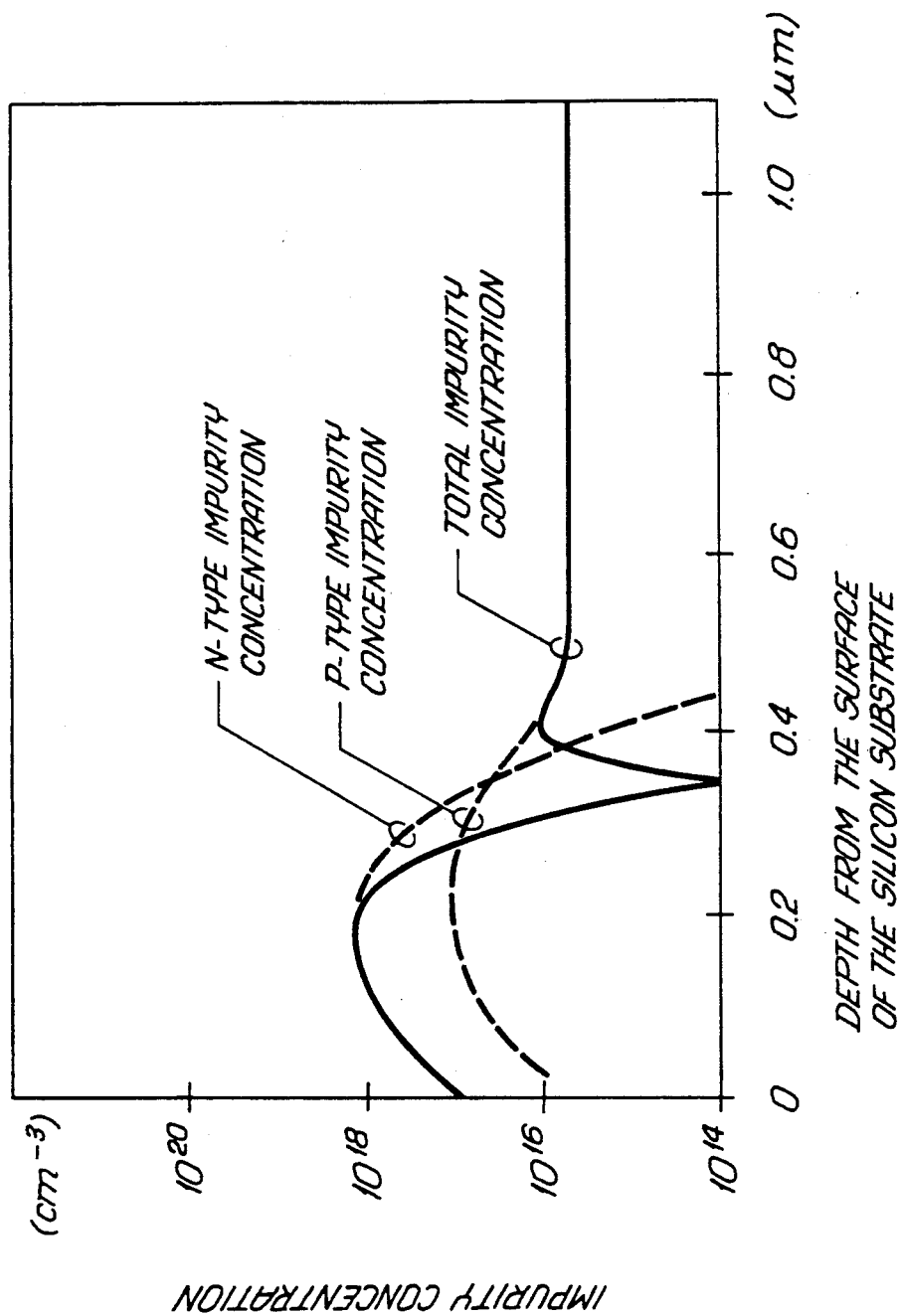

In accordance with the above-described embodiment, the location at which the concentration of impurities of p-type impurity layer 104 having a concentration higher than that of the silicon substrate becomes a maximum is at a depth of 0.2 μm to 0.55 μm. FIGS. 7 and 8 show the profile of impurities in the direction of the depth of the n-type layer 106 of low concentration impurities and the p-type impurity layer 104 in this case. FIG. 7 shows the profile of impurities where at a depth of 0.15 μm the concentration of impurities of the n-type layer 106 of low-concentration impurities become maximum and at a depth of 0.55 μm the concentration of impurities of the p-type impurity layer 104 become maximum. Meanwhile, FIG. 8 shows the profile of impurities where at a depth of 0.15 μm the concentration of impurities of the n-type layer 106 of low-concentration impurities become maximum and at a depth of 0.2 μm the concentration of impurities of the p-type impurity layer 104 become maximum. As can be seen from FIGS. 7 and 8, looking at the overall concentration of impurities in which n-type impurities and p-type impurities are offset with each other, a p-type region having a higher concentration of impurities than that of the silicon substrate is present at a location deeper than the n-type layer 106 of low-concentration impurities. In this case, both the deterioration rate of $Gm_{MAX}$ due to hot carriers and the minimum dimension at which a punch-through takes place show favorable values in FIGS. 11 and 12 in the range of the above-described embodiment. This can be considered as follows: If a p-type layer 104 having a higher concentration of impurities than that of the silicon substrate 101 is formed at a location deeper than the n-type layer 106 of low-concentration impurities due to the p-type impurity layer 104, the spreading of the drain depletion layer can be held, so that it becomes difficult for a punch-through to take place. However, this does not mean that the location can be set too deep. If the location of the p-type impurity layer 104 is set too deep, the depth of the p-type impurity layer 104 becomes greater than that of the spreading region of the drain depletion layer, so that it becomes impossible to restrain the spreading of the drain depletion layer, with the adverse result that a punch-through is liable to occur.

In addition, since the location at which the concentration of impurities of the p-type impurity layer 104 becomes maximum is set deep, the spot where the avalanche phenomenon occurs in the vicinity of a drain due to a drain electric field is brought to a position deep from the substrate, the deterioration rate of Gm due to hot carriers is lowered. Nevertheless, if the depth of the p-type impurity layer 104 is set lower than a certain position, the spot where the avalanche phenomenon occurs does not change, so that the deterioration rate of $Gm_{MAX}$ is not improved to a remarkable extent.

Figure 12:
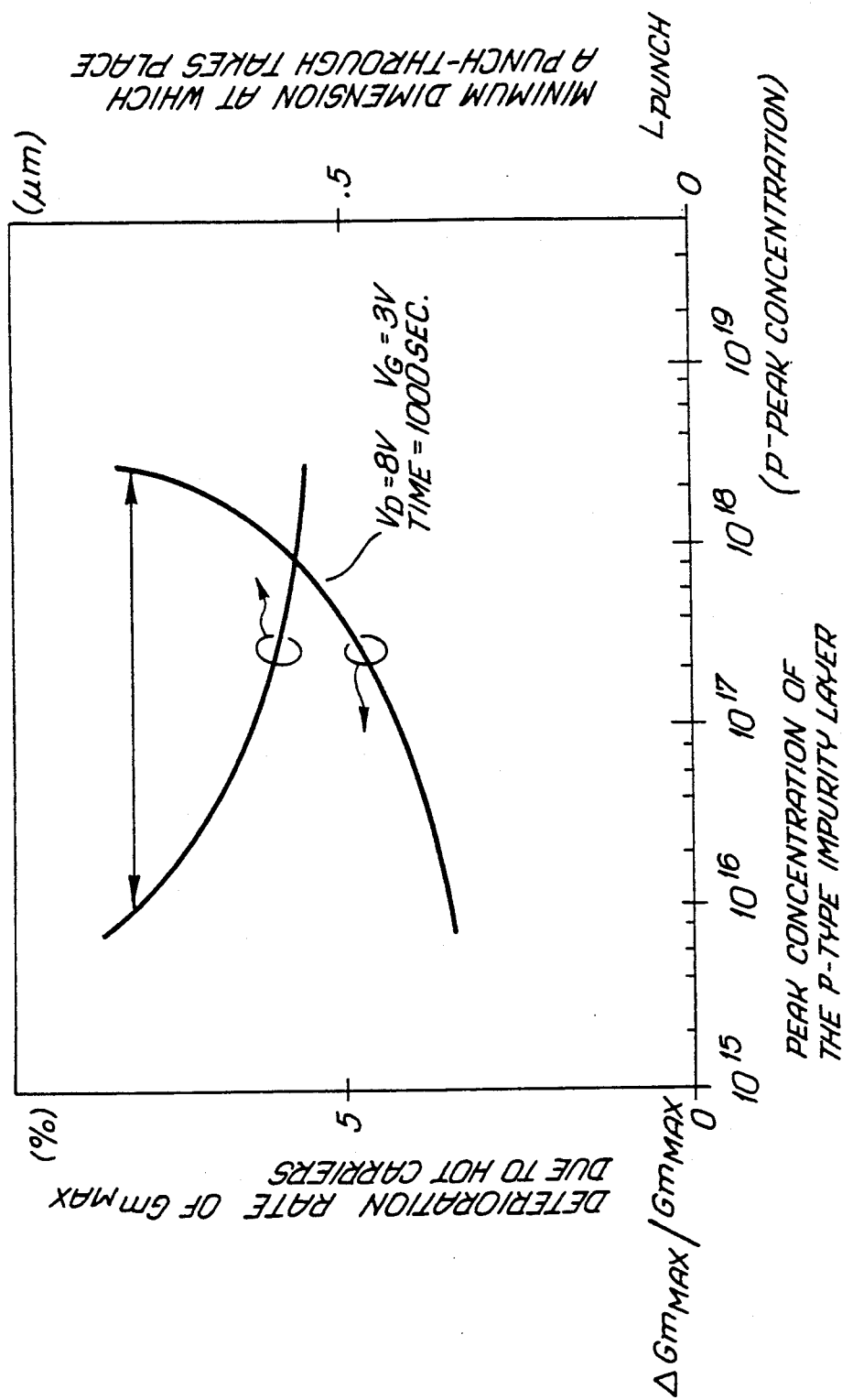

From the foregoing description, it can be seen that an optimal range exists with respect to the location where the concentration of impurities of the p-type impurity layer 104 becomes maximum. If it is assumed that the deterioration rate of $Gm_{MAX}$ due to hot carriers is 8% or less and that the minimum dimension at which a punch-through takes place is 0.8 μm, that range can be determined from FIG. 11 as being in the range of 0.2 μm to 0.7 μm from the surface of the silicon substrate, preferably 0.25 μm to 0.55 μm, and more preferably 0.3 μm to 0.5 μm from the surface where hot carriers and the punch-through takes place. In addition, FIG. 12 is a graph illustrating the maximum value of the concentration of impurities in the p-type impurity layer 104, the deterioration rate of $Gm_{MAX}$ due to hot carriers, and the minimum dimension at which a punch-through takes place. From this graph, the range of the maximum value of the concentration of impurities of the p-type impurity layer 104 can be determined to be in the range of $1 \times 10^{16} cm^{-3}$ to $3 \times 10^{18} cm^{-3}$, preferably $4 \times 10^{16} cm^{-3}$ to $2 \times 10^{18} cm^{-3}$, and more preferably $1 \times 10^{17} cm^{-3}$ to $1 \times 10^{18} cm^{-3}$.

FIG. 13 is a graph illustrating the time dependence of deterioration of Gm due to hot carriers in MOS transistors according to the above-described embodiment of the invention and an example of the prior art, in which A relates to the invention and B relates to the prior art. This diagram reveals that the deterioration rate of Gm in accordance with the invention is approximately 1/5 that of the prior art.

Although in this embodiment, boron is used as the p-type impurity of the p-type impurity layer 104, aluminum, gallium, or indium may alternatively be used, or a combination of such impurities, such as boron and aluminum, may be used. In addition, although phosphorous is used as the n-type impurity in the n-type layer 106 of low-concentration impurities, arsenic or antimony may be used, or a combination of such impurities, such as arsenic and phosphorous, may be used.

Figure 4:
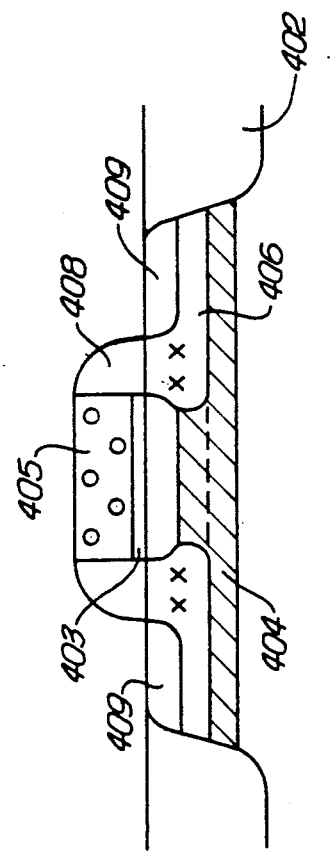
FIG. 4 is a schematic cross-sectional view illustrating another embodiment of the present invention.

In addition, although in this embodiment a polycrystalline silicon film is used for the gate electrode, a refractory metal such as titanium, molybdenum, or tungsten may be used, or a refractory metal polycide film in which a refractory metal such as titanium, molybdenum, or tungsten or a silicide thereof is formed on a semiconductor film such as a polycrystalline silicon film, or a refractory metal itself or a silicide thereof itself may be used. Furthermore, although in this embodiment a silicon oxide film formed by the CVD process is used as the side wall insulating film, a silicon oxide film obtained by thermally oxidizing a polycrystalline silicon film may be used, or a silicon nitride film may be used. Moreover, although in this embodiment the element isolating region is formed by the LOCOS process, it is possible to use the trench isolation process in which, after a trench is provided in the semiconductor substrate, the one obtained by embedding the trench with an insulating film such as an oxide film is used as the element isolating region (see FIG. 4).

In this embodiment, if the transistor shown in FIG. 1 is used as a transistor constituting a flip-flop of a memory cell of an SRAM, strong protection can be obtained against soft errors caused by α-particles. If α-particles penetrate into the n-type diffusion layer in a drain region of the transistor constituting a flip-flop of an SRAM, pairs of electrons and holes are generated in a depletion layer formed between an n+ diffusion layer and a p-type substrate. The generated electrons are drawn by an electric field in the direction of a drain of the transistor and are injected into the drain diffusion layer. At this time, if the drain diffusion layer is in the high state of the flip-flop, the potential is lowered by the injected electrons, so that the high state turns to the low state. This is the soft error due to α-particles. However, in the embodiment shown in FIG. 1(h), even if the drain diffusion layer is in the high state, the width of the depletion layer becomes narrow due to the n-type impurity layers 106, 109 and the p-type impurity layer 104. In this case, even if α-particles penetrate into the n-type diffusion layer in the drain region, since the width of the aforementioned depletion layer is made narrow, the number of pairs of electrons and holes generated in the depletion layer becomes small, so that strong protection against soft errors caused by α-particles can be obtained.

Although the embodiment described is an n-channel transistor, it goes without saying that a similar effect can be obtained if the present invention is applied to a p-channel transistor.

In accordance with the present invention, since a punch-through phenomenon is unlikely to occur, MOS transistors can be provided with very short channels up to submicron size, which allows not only high levels of integration and high speed of LSIs to be attained but also the rate of deterioration of characteristics due to hot carriers can be minimized. In addition, if the MOS device is used for a memory cell of an SRAM, its protection against soft errors caused by α-particles can be enhanced. Hence, there is an advantage in that the present invention plays a large role in improving the reliability of LSIs.

This application relates to subject matter disclosed in Japanese Patent Application No. 205535/88, filed Aug. 18, 1988, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
    a semiconductor substrate of a first conductivity type having a first impurity concentration, said substrate having an exterior surface and said exterior surface having a gate region;
    a first belt-shaped impurity layer of said first conductivity type formed in said semiconductor substrate so as to be spaced apart from the exterior surface of said semiconductor substrate and which has a second impurity concentration which is higher than said first concentration at a first depth from the exterior surface of said semiconductor substrate, said first layer extending beneath the entirety of said gate region;
    a gate electrode having side walls formed on said semiconductor substrate at said gate region and a first insulating film interposed between said substrate and said gate electrode;

two first impurity regions of a second conductivity type formed in said semiconductor substrate on both sides of said gate electrode so as to be spaced apart from each other and having a third impurity concentration at a second depth from the exterior surface of said semiconductor substrate, each region having a lower surface which is above said first impurity layer, said regions having a portion projecting downward of said gate electrode at a location adjacent to said first impurity layer;

side wall insulating films each formed on a respective side wall of said gate electrode; and second impurity regions of said second conductivity type formed in said first regions laterally of said side wall insulating films and having a fourth impurity concentration higher than said third concentration, wherein said first impurity layer has a maximum impurity concentration at a depth of 0.2 to 0.7 μm from the exterior surface of said substrate.

2. A semiconductor device according to claim 1 wherein said second concentration of said first impurity layer has a maximum value in the range of $1 \times 10^{16}$ to $3 \times 10^{18} cm^{-3}$.

3. A semiconductor device comprising:

a semiconductor substrate of a first conductivity type having a first impurity concentration, said substrate having an exterior surface and said exterior surface having a gate region;

a first belt-shaped impurity layer of said first conductivity type formed in said semiconductor substrate so as to be spaced apart from the exterior surface of said semiconductor substrate and which has a second impurity concentration which is higher than said first concentration at a first depth from the exterior surface of said semiconductor substrate, said first layer extending beneath the entirety of said gate region;

a gate electrode having side walls formed on said semiconductor substrate at said gate region and a first insulating film interposed between said substrate and said gate electrode;

two first impurity regions of a second conductivity type formed in said semiconductor substrate on both sides of said gate electrode so as to be spaced apart from each other and having a third impurity concentration at a second depth from the exterior surface of said semiconductor substrate, each region having a lower surface which is above said first impurity layer, said regions having a portion projecting downward of said gate electrode at a location adjacent to said first impurity layer;

side wall insulating films each formed on a respective side wall of said gate electrode; and second impurity regions of said second conductivity type formed in said first regions laterally of said side wall insulating films and having a fourth impurity concentration higher than said third concentration.

wherein said second concentration of said first impurity layer has a maximum value in the range of $1 \times 10^{16}$ to $3 \times 10^{18} cm^{-3}$.

4. A semiconductor device comprising:

a semiconductor substrate of a first conductivity type having a first impurity concentration, said substrate having an exterior surface and said exterior surface having a gate region;

a first belt-shaped impurity layer of said first conductivity type formed in said semiconductor substrate so as to be spaced apart from the exterior surface of said semiconductor substrate and which has a second impurity concentration which is higher than said first concentration at a first depth from the exterior surface of said semiconductor substrate, said first layer extending beneath the entirety of said gate region;

a gate electrode having side walls formed on said semiconductor substrate at said gate region and a first insulating film interposed between said substrate and said gate electrode;

two first impurity regions of a second conductivity type formed in said semiconductor substrate on both sides of said gate electrode so as to be spaced apart from each other and having a third impurity concentration at a second depth from the exterior surface of said semiconductor substrate, each region having a lower surface which is above said first impurity layer, said regions having a portion projecting downward of said gate electrode at a location adjacent to said first impurity layer;

side wall insulating films each formed on a respective side wall of said gate electrode; and second impurity regions of said second conductivity type formed in said first regions laterally of said side wall insulating films and having a fourth impurity concentration higher than said third concentration.

wherein said first impurity region has a maximum impurity concentration at a depth of 0.05 to 0.25 μm from the exterior surface of said substrate.

5. A semiconductor device according to claim 4 wherein said third concentration of said first impurity region α has a maximum value in the range of $\times 10^{16}$ to $6 \times 10^{18} cm^{-3}$.

6. A semiconductor device comprising:

a semiconductor substrate of a first conductivity type having a first impurity concentration, said substrate having an exterior surface and said exterior surface having a gate region;

a first belt-shaped impurity layer of said first conductivity type formed in said semiconductor substrate so as to be spaced apart from the exterior surface of said semiconductor substrate and which has a second impurity concentration which is higher than said first concentration at a first depth from the exterior surface of said semiconductor substrate, said first layer extending beneath the entirety of said gate region;

a gate electrode having side walls formed on said semiconductor substrate at said gate region and a first insulating film interposed between said substrate and said gate electrode;

two first impurity regions of a second conductivity type formed in said semiconductor substrate on both sides of said gate electrode so as to be spaced apart from each other and having a third impurity concentration at a second depth from the exterior surface of said semiconductor substrate, each region having a lower surface which is above said first impurity layer, said regions having a portion projecting downward of said gate electrode at a location adjacent to said first impurity layer;

side wall insulating films each formed on a respective side wall of said gate electrode; and second impurity regions of said second conductivity type formed in said first regions laterally of said side wall insulating films and having a fourth impurity concentration higher than said third concentration.

wherein said third concentration of said first impurity region has a maximum value in the range of $1 \times 10^{16}$ to $6 \times 10^{18} cm^{-3}$.

7. A semiconductor device comprising:

a semiconductor substrate of a first conductivity type having a first impurity concentration, said substrate having an exterior surface and said exterior surface having a gate region;

a first belt-shaped impurity layer of said first conductivity type formed in said semiconductor substrate so as to be spaced apart from the exterior surface of said semiconductor substrate and which has a second impurity concentration which is higher than said first concentration at a first depth from the exterior surface of said semiconductor substrate, said first layer extending beneath the entirety of said gate region;

a gate electrode having side walls formed on said semiconductor substrate at said gate region and a first insulating film interposed between said substrate and said gate electrode;

two first impurity regions of a second conductivity type formed in said semiconductor substrate on both sides of said gate electrode so as to be spaced apart from each other and having a third impurity concentration at a second depth from the exterior surface of said semiconductor substrate, each region having a lower surface which is above said first impurity layer, said regions having a portion projecting downward of said gate electrode at a location adjacent to said first impurity layer;

side wall insulating films each formed on a respective side wall of said gate electrode; and second impurity regions of said second conductivity type formed in said first regions laterally of said side wall insulating films and having a fourth impurity concentration higher than said third concentration.

wherein:

said first impurity layer has a maximum impurity concentration at a depth of 0.2 to 0.7 $\mu$m from the exterior surface of said substrate;

said second concentration of said first impurity layer has a maximum value in the range of $1 \times 10^{16}$ to $3 \times 10^{18} cm^{-3}$;

said first impurity region has a maximum impurity concentration at a depth of 0.5 to 0.25 $\mu$m from the exterior surface of said substrate; and said third concentration of said first impurity region has a maximum value in the range of $\times 10^{16}$ to $6 \times 10^{18} cm^{-3}$.

* * * * *